United States Patent
Inoue (10) Patent No.: US 9,337,215 B2
(45) Date of Patent: May 10, 2016

(54) METHOD FOR FABRICATING ACTIVE MATRIX SUBSTRATE AND METHOD FOR FABRICATING DISPLAY DEVICE

(71) Applicant: Sharp Kabushiki Kaisha, Osaka-shi, Osaka (JP)

(72) Inventor: Tsuyoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/401,158

(22) PCT Filed: Jun. 17, 2013

(86) PCT No.: PCT/JP2013/003756
§ 371 (c)(1),
(2) Date: Nov. 14, 2014

(87) PCT Pub. No.: WO2013/190815
PCT Pub. Date: Dec. 27, 2013

(65) Prior Publication Data
US 2015/0126019 A1   May 7, 2015

(30) Foreign Application Priority Data
Jun. 22, 2012   (JP) .................................. 2012-140886

(51) Int. Cl.
*H01L 21/027* (2006.01)
*H01L 27/12* (2006.01)
*G02F 1/1362* (2006.01)
*H01L 21/768* (2006.01)

(52) U.S. Cl.
CPC ...... *H01L 27/1244* (2013.01); *G02F 1/136204* (2013.01); *G02F 1/136286* (2013.01); *H01L 21/76837* (2013.01); *H01L 27/124* (2013.01); *H01L 27/1259* (2013.01); *H01L 27/1288* (2013.01); *G02F 2001/136295* (2013.01)

(58) Field of Classification Search
CPC ................... H01L 21/02518; H01L 21/02697; H01L 21/0334; G02F 1/133302; G02F 1/134309
See application file for complete search history.

(56) References Cited

U.S. PATENT DOCUMENTS

| 4,678,282 | A | * | 7/1987 | Yaniv et al. | 349/42 |
| 5,521,728 | A | | 5/1996 | Kodate et al. | |
| 6,876,405 | B1 | * | 4/2005 | Park et al. | 349/43 |

FOREIGN PATENT DOCUMENTS

JP   07-225394 A   8/1995

* cited by examiner

Primary Examiner — Zandra Smith
Assistant Examiner — Evan Clinton
(74) Attorney, Agent, or Firm — Keating & Bennett, LLP (57) ABSTRACT

A gate line is formed on a pixel region, and a plurality of wiring layers are formed on a frame region. Next, a gate insulating layer and a semiconductor material layer are formed to cover the wiring layers and the gate line. Next, a first resist is formed to cover a portion of the semiconductor material layer over the pixel region, and second resists are formed to individually cover portions of the gate insulating layer between adjacent pairs of the wiring layers. Next, portions of the semiconductor material layer exposed from the first and second resists and are etched by dry etching to form semiconductor layers of semiconductor elements.

13 Claims, 11 Drawing Sheets

METHOD FOR FABRICATING ACTIVE MATRIX SUBSTRATE AND METHOD FOR FABRICATING DISPLAY DEVICE

TECHNICAL FIELD

The present invention relates to methods for fabricating an active matrix substrate and methods for fabricating a display device.

BACKGROUND ART

In recent years, thin display devices (flat panel displays), such as liquid crystal displays, have been widely used in the form of, for example, display devices for electronic devices, such as smartphones and tablet personal computers.

Such a display device includes a first substrate serving as an active matrix substrate, and a second substrate facing the first substrate. For example, a liquid crystal display includes a liquid crystal layer between first and second substrates. An organic electroluminescent (EL) display device includes a light-emitting layer between first and second substrates.

The display device includes a frame region extending along the perimeters of the first and second substrates and serving as a non-display region, and a pixel region formed inside the frame region. The pixel region includes a plurality of pixels each including a semiconductor element. A region of the first substrate corresponding to the frame region includes a plurality of wiring layers drawn from the pixel region. The wiring layers are parallel to one another.

The long wiring layers in the frame region tend to be electrically charged with a relatively large amount of electric charge. For this reason, electrostatic discharge (ESD) between an adjacent pair of the wiring layers causes a dielectric breakdown of an insulating layer covering the wiring layers.

To address this problem, an active matrix substrate described in PATENT DOCUMENT 1 has a frame region including a plurality of light blocking layers, a gate insulating layer, a semiconductor layer, a plurality of wiring layers, and a protection insulating layer. The light blocking layers are formed on the surface of an insulative substrate, and are made of metal. The gate insulating layer covers the light blocking layers. The semiconductor layer is formed on the entire surface of the gate insulating layer. The wiring layers cover the surfaces of portions of the semiconductor layer between adjacent pairs of the light blocking layers. The protection insulating layer covers the wiring layers. The semiconductor layer is formed in the same process step as the process step of forming semiconductor layers forming portions of semiconductor elements over a pixel region of the active matrix substrate.

This configuration allows the formation of transistors each including a portion of a corresponding one of the light blocking layers as a gate and portions of corresponding two of the wiring layers as a source and a drain, and thus allows the travel of electric charge from one of the corresponding two of the wiring layers through the semiconductor layer to the other one thereof when the potential difference between the charged wiring layers has increased. This reduces dielectric breakdown of the protection insulating layer due to the ESD.

CITATION LIST

Patent Document

PATENT DOCUMENT 1: Japanese Unexamined Patent Publication No. H07-225394

SUMMARY OF THE INVENTION

Technical Problem

In the case where wiring layers are covered with a gate insulating layer unlike the configuration of PATENT DOCUMENT 1 in which the wiring layers are disposed over the gate insulating layer, dry etching of a semiconductor layer on the surface of the gate insulating layer may cause ESD, and the ESD may cause dielectric breakdown of the gate insulating layer.

In such a case, no wiring layer forms a portion of a transistor unlike PATENT DOCUMENT 1 described above, and unfortunately, dielectric breakdown of the gate insulating layer arising from the ESD cannot be thus prevented.

It is therefore an object of the present invention to prevent dielectric breakdown of a gate insulating layer arising from electrostatic discharge between an adjacent pair of wiring layers when an active matrix substrate having a frame region including the wiring layers covered with the gate insulating layer is fabricated.

Solution to the Problem

In order to achieve the object, a method for fabricating an active matrix substrate according to a first aspect of the invention includes: forming, on a pixel region of the active matrix substrate, a gate line forming portions of a plurality of semiconductor elements, and forming a plurality of wiring layers on a frame region of the active matrix substrate surrounding the pixel region, the wiring layers being made of a same material as the gate line and extending in parallel; forming a gate insulating layer on the frame region and the pixel region to cover the wiring layers and the gate line; forming a semiconductor material layer on a surface of the gate insulating layer on the frame region and the pixel region; forming a first resist covering a portion of the semiconductor material layer over the pixel region, and second resists individually covering portions of the gate insulating layer between adjacent pairs of the wiring layers; and etching portions of the semiconductor material layer exposed from the first and second resists by dry etching to form semiconductor layers forming portions of the semiconductor elements.

According to the first aspect of the invention, in the etching of the portions of the semiconductor material layer by dry etching, the portions of the gate insulating layer between the adjacent pairs of the wiring layers are covered with the second resists, thereby preventing electrostatic discharge between the adjacent pairs of the wiring layers. This prevention can prevent dielectric breakdown of the gate insulating layer covering the wiring layers.

According to a second aspect of the invention, the method of the first aspect of the invention may further include: after the etching of the portions of the semiconductor material layer by dry etching, forming light blocking layers individually covering portions of the gate insulating layer between the adjacent pairs of the wiring layers.

In the second aspect of the invention, the light blocking layers block light between the adjacent pairs of the wiring layers. This can prevent light from leaking through the frame region. In addition, since no dielectric breakdown occurs in the portions of the gate insulating layer between the adjacent pairs of the wiring layers, short circuits through the light blocking layers between the adjacent pairs of the wiring layers can be prevented.

According to a third aspect of the invention, in the method of the second aspect of the invention, in the forming of the light blocking layers, the light blocking layers may be made of a same material as a source electrode forming a portion of each semiconductor element.

In the third aspect of the invention, since the light blocking layers can be formed in the same process step as the process step of forming the source electrode, an increase in the number of process steps due to the provision of the light blocking layers can be prevented.

A fourth aspect of the invention is directed to a method for fabricating a display device by bonding an active matrix substrate and a counter substrate together. The method includes: fabricating the active matrix substrate. The fabricating of the active matrix substrate includes forming, on a pixel region of the active matrix substrate, a gate line forming portions of a plurality of semiconductor elements, and forming a plurality of wiring layers on a frame region of the active matrix substrate surrounding the pixel region, the wiring layers being made of a same material as the gate line and extending in parallel; forming a gate insulating layer on the frame region and the pixel region to cover the wiring layers and the gate line; forming a semiconductor material layer on a surface of the gate insulating layer on the frame region and the pixel region; forming a first resist covering a portion of the semiconductor material layer over the pixel region, and second resists individually covering portions of the gate insulating layer between adjacent pairs of the wiring layers; and etching portions of the semiconductor material layer exposed from the first and second resists by dry etching to form semiconductor layers forming portions of the semiconductor elements.

According to the fourth aspect of the invention, in the etching of the portions of the semiconductor material layer by dry etching, the portions of the gate insulating layer between the adjacent pairs of the wiring layers are covered with the second resists, thereby preventing electrostatic discharge between the adjacent pairs of the wiring layers. This prevention can prevent dielectric breakdown of the gate insulating layer covering the wiring layers.

According to a fifth aspect of the invention, the method of the fourth aspect of the invention may further include: after the etching of the portions of the semiconductor material layer by dry etching, forming light blocking layers individually covering portions of the gate insulating layer between the adjacent pairs of the wiring layers.

According to the fifth aspect of the invention, the light blocking layers block light between the adjacent pairs of the wiring layers. This can prevent light from leaking through the frame region. In addition, since no dielectric breakdown occurs in the portions of the gate insulating layer between the adjacent pairs of the wiring layers, short circuits through the light blocking layers between the adjacent pairs of the wiring layers can be prevented.

According to a sixth aspect of the invention, in the method of the fifth aspect of the invention, in the forming of the light blocking layers, the light blocking layers may be made of a same material as a source electrode forming a portion of each semiconductor element.

According to the sixth aspect of the invention, since the light blocking layers can be formed in the same process step as the process step of forming the source electrode, an increase in the number of process steps due to the provision of the light blocking layers can be prevented.

Advantages of the Invention

According to the present invention, in the etching of the portions of the semiconductor material layer by dry etching, the portions of the gate insulating layer between the adjacent pairs of the wiring layers are covered with the second resists, thereby preventing electrostatic discharge between the adjacent pairs of the wiring layers. This prevention can prevent dielectric breakdown of the gate insulating layer covering the wiring layers.

DESCRIPTION OF EMBODIMENTS

An embodiment of the present invention will now be described with reference to the drawings. The present invention should not be limited to the following embodiment.

Figure 5:
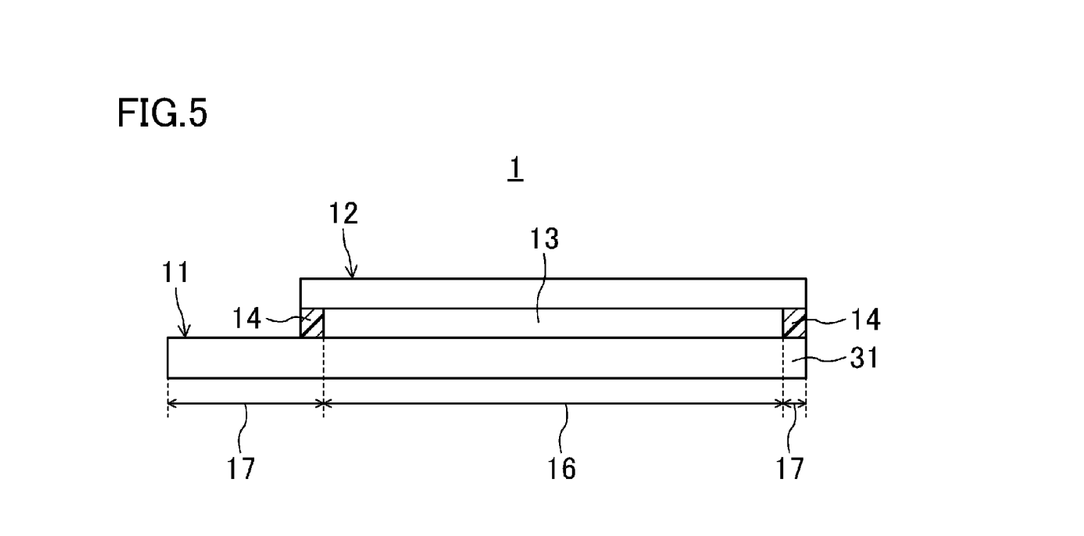
FIG. 5 is a schematic cross-sectional view of the configuration of a liquid crystal display.
Figure 6:
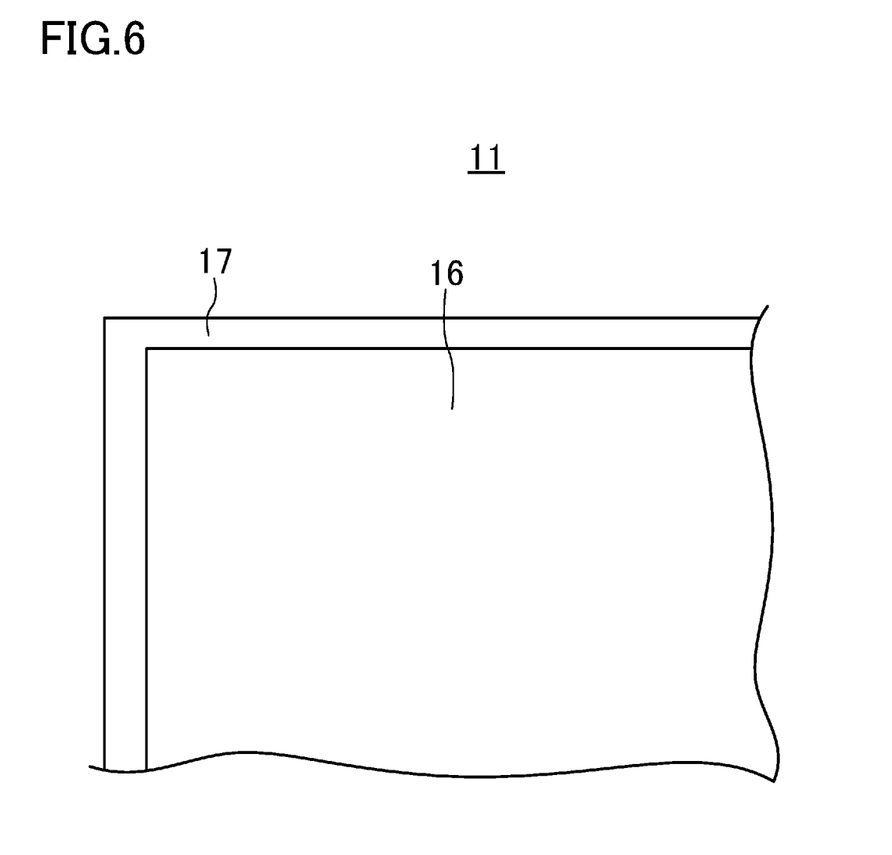
FIG. 6 is an enlarged plan view of a portion of the TFT substrate.

In this embodiment, a liquid crystal display 1 will be described as an example display device according to the present invention. FIG. 5 is a schematic cross-sectional view of the configuration of the liquid crystal display 1. FIG. 6 is an enlarged plan view of a portion of a TFT substrate.

As illustrated in FIG. 5, the liquid crystal display 1 includes a TFT substrate 11 serving as a first substrate, a counter substrate 12 serving as a second substrate and facing the TFT substrate 11, and a liquid crystal layer 13 interposed between the counter substrate 12 and the TFT substrate 11. The liquid crystal layer 13 is sealed between the TFT substrate 11 and the counter substrate 12 with a frame-shaped sealing member 14.

As illustrated in FIG. 5, the liquid crystal display 1 has a pixel region 16 and a frame region 17. The pixel region 16 serves as a display region, and includes a plurality of pixels. The frame region 17 serves as a non-display region, and surrounds the pixel region 16.

Although not shown, the counter substrate 12 includes a glass substrate serving as an insulative substrate, color filters formed on a surface of the glass substrate near the liquid crystal layer 13, a common electrode, and a black matrix. The common electrode is a transparent conductive film made of, for example, indium tin oxide (ITO), and is formed throughout the pixel region 16.

Figure 1:
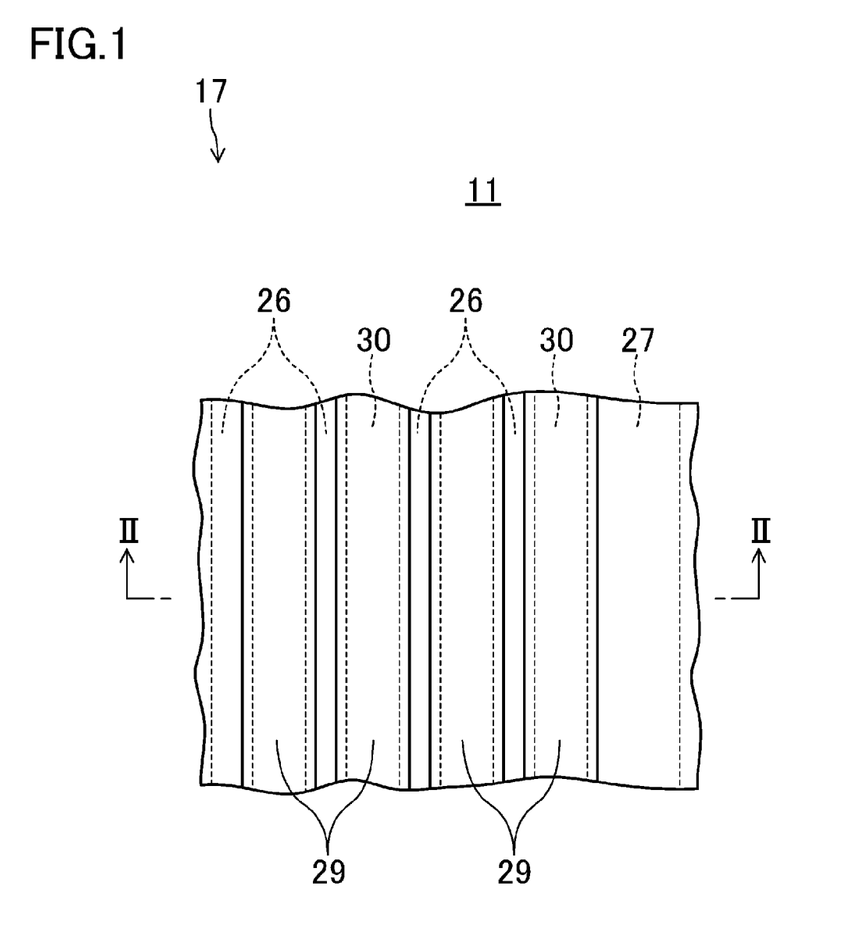
FIG. 1 is an enlarged plan view of a region of a thin film transistor (TFT) substrate corresponding to a frame region.
Figure 2:
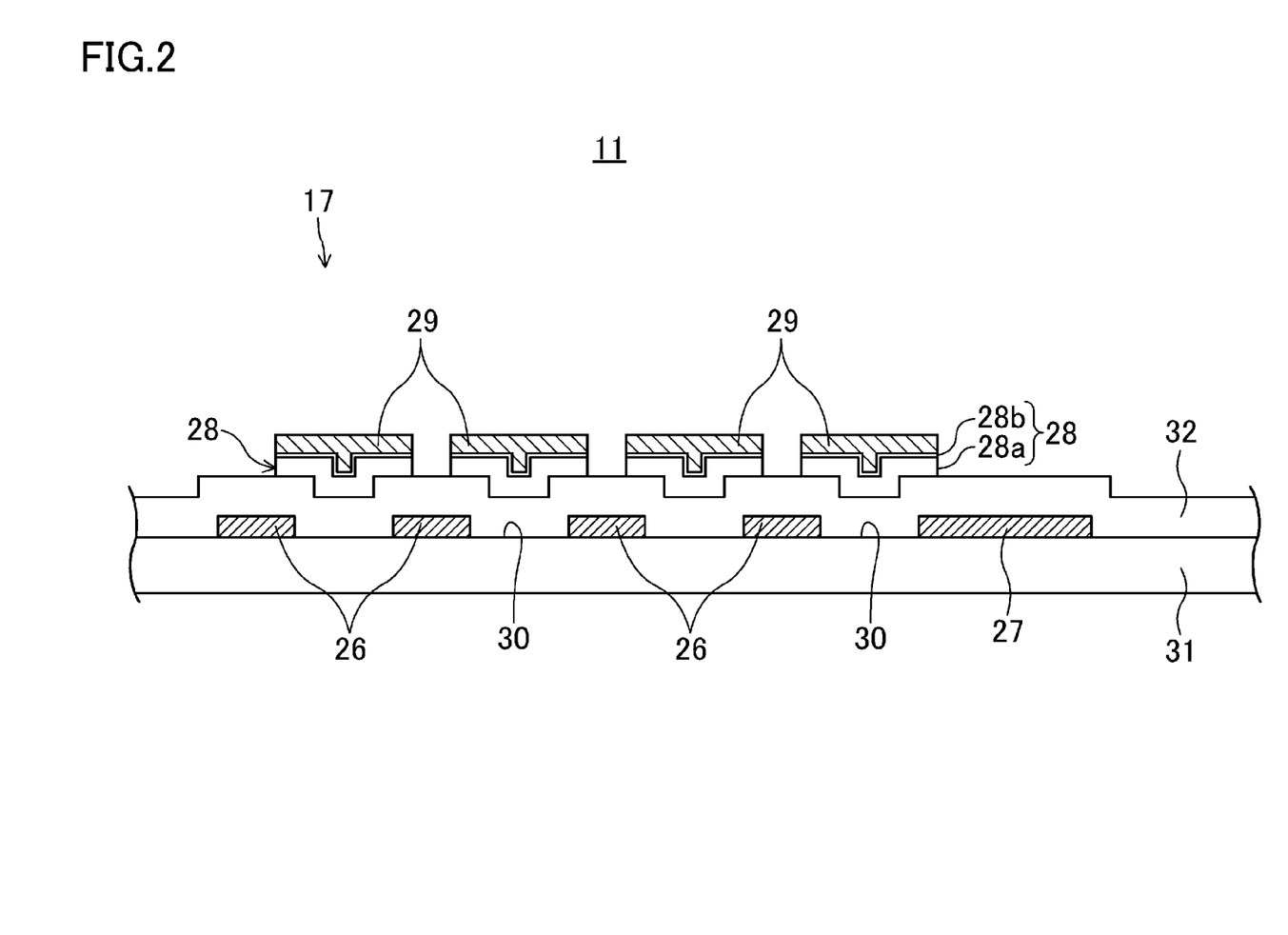
FIG. 2 is a cross-sectional view taken along the line II-II in FIG. 1.
Figure 3:
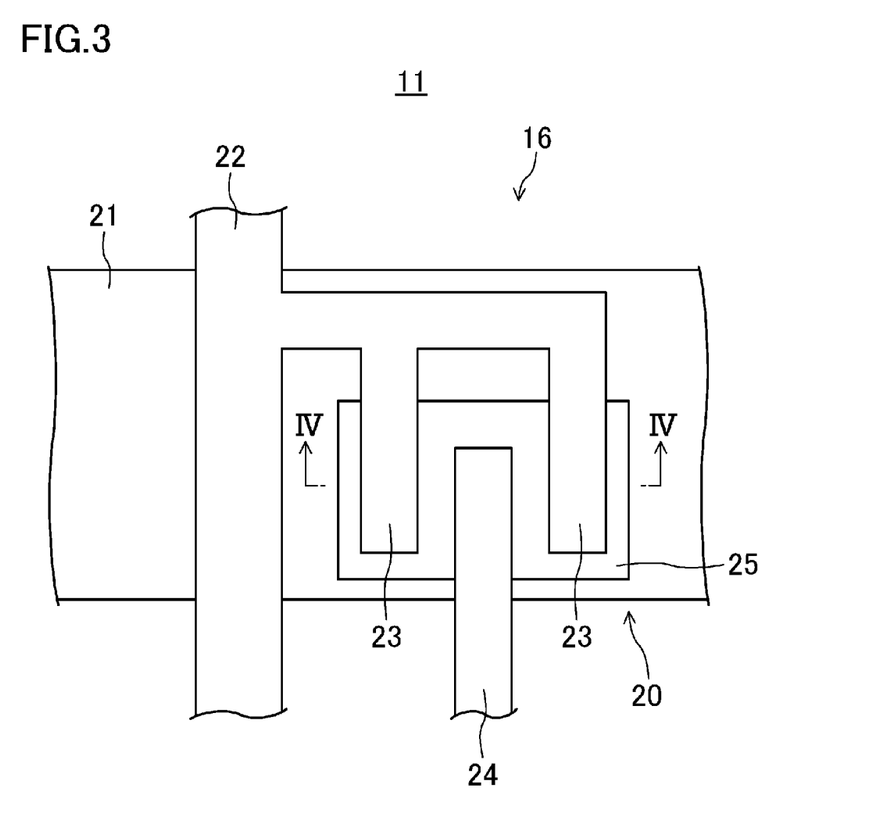
FIG. 3 is an enlarged plan view of a TFT of a pixel in a pixel region.
Figure 4:
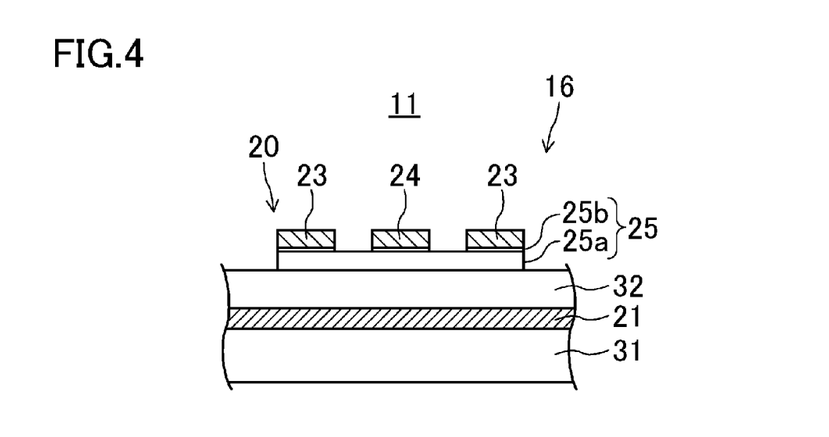
FIG. 4 is a cross-sectional view taken along the line IV-IV in FIG. 3.

Here, FIG. 1 is an enlarged plan view of a region of the TFT substrate 11 corresponding to the frame region 17. FIG. 2 is a cross-sectional view taken along the line II-II in FIG. 1. FIG. 3 is an enlarged plan view of a TFT 20 of one of the pixels in the pixel region 16. FIG. 4 is a cross-sectional view taken along the line IV-IV in FIG. 3.

<Configuration of Pixel Region>

The TFT substrate 11 is an active matrix substrate, and a region of the TFT substrate 11 corresponding to the pixel region 16 includes a plurality of thin film transistors (TFTs) 20 being semiconductor elements, and gate lines 21 and source lines 22 each connected to corresponding ones of the TFTs 20 as illustrated in FIGS. 3 and 4. The TFTs 20, the gate lines 21, and the source lines 22 are formed on a glass substrate 31 serving as an insulative substrate.

In other words, the gate lines 21 are formed on the surface of the glass substrate 31. A gate insulating layer 32 is further formed on the glass substrate 31 to cover the gate lines 21. The source lines 22 are formed on the surface of the gate insulating layer 32, and extend to intersect the gate lines 21. The gate lines 21 and the source lines 22 are entirely arranged in a grid pattern.

A plurality of island-like first semiconductor layers 25 are formed on regions of the surface of the gate insulating layer 32 overlapping the gate lines 21. As illustrated in FIG. 4, the first semiconductor layers 25 each include an i layer (an intrinsic semiconductor layer) 25a formed on the surface of the gate insulating layer 32, and $n^+$ layers 25b placed on the i layer 25a.

Source electrodes 23 and drain electrodes 24 are formed on the gate insulating layer 32. One of the source electrodes 23, a corresponding one of the drain electrodes 24, and a corresponding one of the first semiconductor layers 25 form a TFT 20. The $n^+$ layers 25b of each first semiconductor layer 25 are formed only on regions of the i layer 25a overlapped by a corresponding one of the source electrode 23 and a corresponding one of the drain electrode 24. In other words, the i layer 25a is exposed from the corresponding one of the source electrodes 23 and the corresponding one of the drain electrodes 24.

Regions of each source line 22 overlapping the gate lines 21 each branch to form a source electrode 23. A distal end portion of each source electrode 23 bifurcates into two portions, and the two portions at least partially overlap a corresponding one of the first semiconductor layers 25. In contrast, one end portion of each drain electrode 24 overlaps a corresponding one of the first semiconductor layers 25, and is placed between the two portions into which the distal end portion of a corresponding one of the source electrodes 23 bifurcates.

The other end portion of the drain electrode 24 is connected to an unshown pixel electrode. The pixel electrode is a transparent conductive film made of, for example, ITO.

<Configuration of Frame Region>

As illustrated in FIG. 2, a region of the TFT substrate 11 corresponding to the frame region 17 includes a plurality of wiring layers 26, 27 extending in parallel. The wiring layers 26, 27 are made of the same material as the gate lines 21. The wiring layers 26, 27 include gate lead lines 26 and a common line 27.

The gate lead lines 26 are drawn from the pixel region 16, and are each connected to a corresponding one of the gate lines 21. The common line 27 applies a predetermined voltage to the common electrode of the counter substrate 12.

The gate lead lines 26 and the common line 27 are formed on the surface of the glass substrate 31, and are covered with the gate insulating layer 32. Second semiconductor layers 28 are formed on the surface of the gate insulating layer 32 to individually cover line-to-line regions 30 of the glass substrate 31 between adjacent pairs of the wiring layers 26, 27.

The second semiconductor layers 28 are made of the same material as the first semiconductor layers 25. Specifically, the second semiconductor layers 28 each include an i layer 28a formed on the surface of the gate insulating layer 32, and an $n^+$ layer 28b placed on the i layer 28a.

Light blocking layers 29 are each formed on the surface of one of the second semiconductor layers 28. The light blocking layers 29 are made of the same material as the source electrodes 23. The light blocking layers 29 each have substantially the same shape as the second semiconductor layers 28, and are formed over regions of the glass substrate 31 over which the second semiconductor layers 28 are formed. In other words, the light blocking layers 29 also individually cover the line-to-line regions 30 in a manner similar to that of the second semiconductor layers 28.

As illustrated in FIGS. 1 and 2, a predetermined space is formed between each adjacent pair of the light blocking layers 29 (i.e., between each adjacent pair of the second semiconductor layers 28) and over the wiring layers 26, 27. Both side portions of each wiring layer 26, 27 in the width direction thereof are overlapped by corresponding ones of the light blocking layers 29 and corresponding ones of the second semiconductor layers 28.

—Fabrication Method—

A liquid crystal display 1 is fabricated by bonding a TFT substrate 11 and a counter substrate 12 together. Specifically, a frame-shaped sealing member 14 is formed on a previously fabricated TFT substrate 11 or a previously fabricated counter substrate 12, and a liquid crystal material is then dropped so as to be fed to the inside of the frame-shaped sealing member 14. A thermosetting or ultraviolet-curable resin is used as the sealing member 14. Subsequently, the TFT substrate 11 and the counter substrate 12 are bonded together through the sealing member 14 and the liquid crystal material. Thereafter, the sealing member 14 is cured. Thus, the liquid crystal display 1 is fabricated.

Next, a method for fabricating a TFT substrate 11 will be described with reference to FIGS. 7-14.

Figure 7:
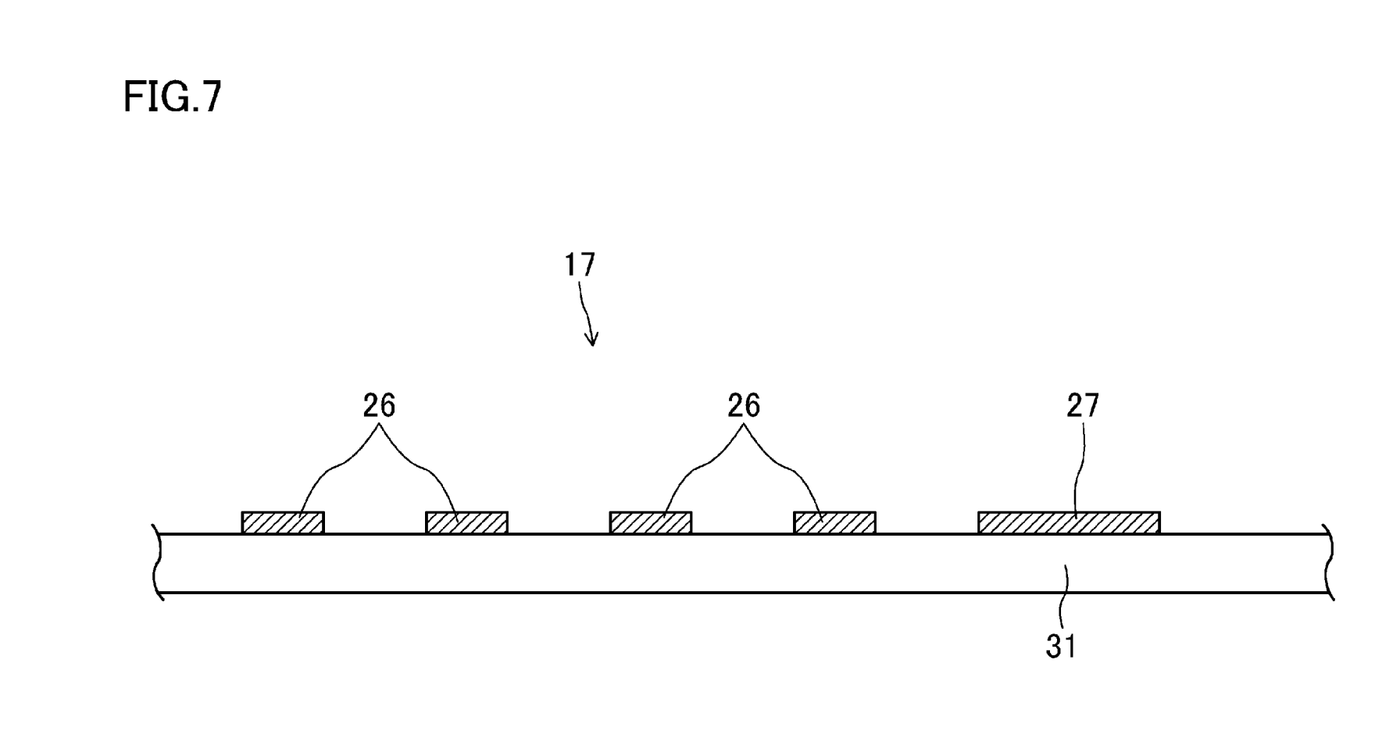
FIG. 7 is a cross-sectional view of wiring layers formed on a glass substrate.
Figure 8:
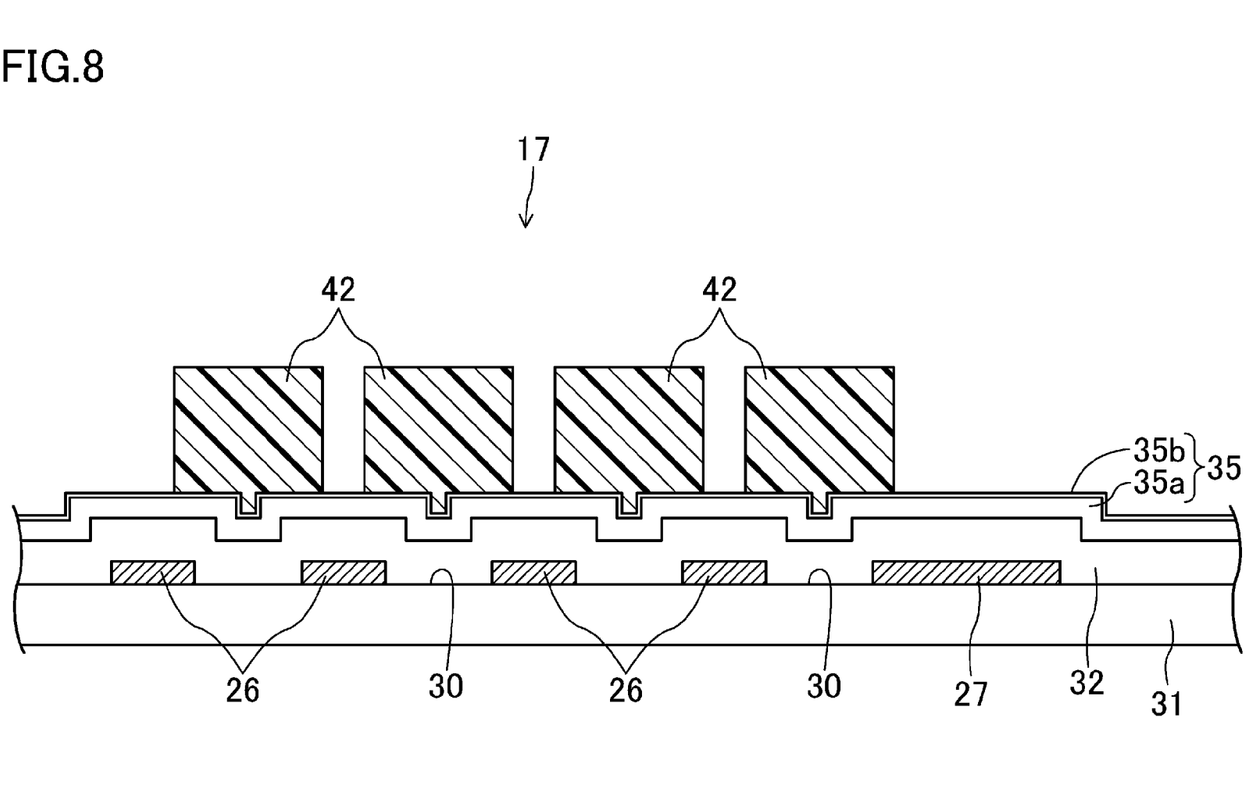
FIG. 8 is a cross-sectional view of second resists formed on the surface of a semiconductor material layer.
Figure 9:
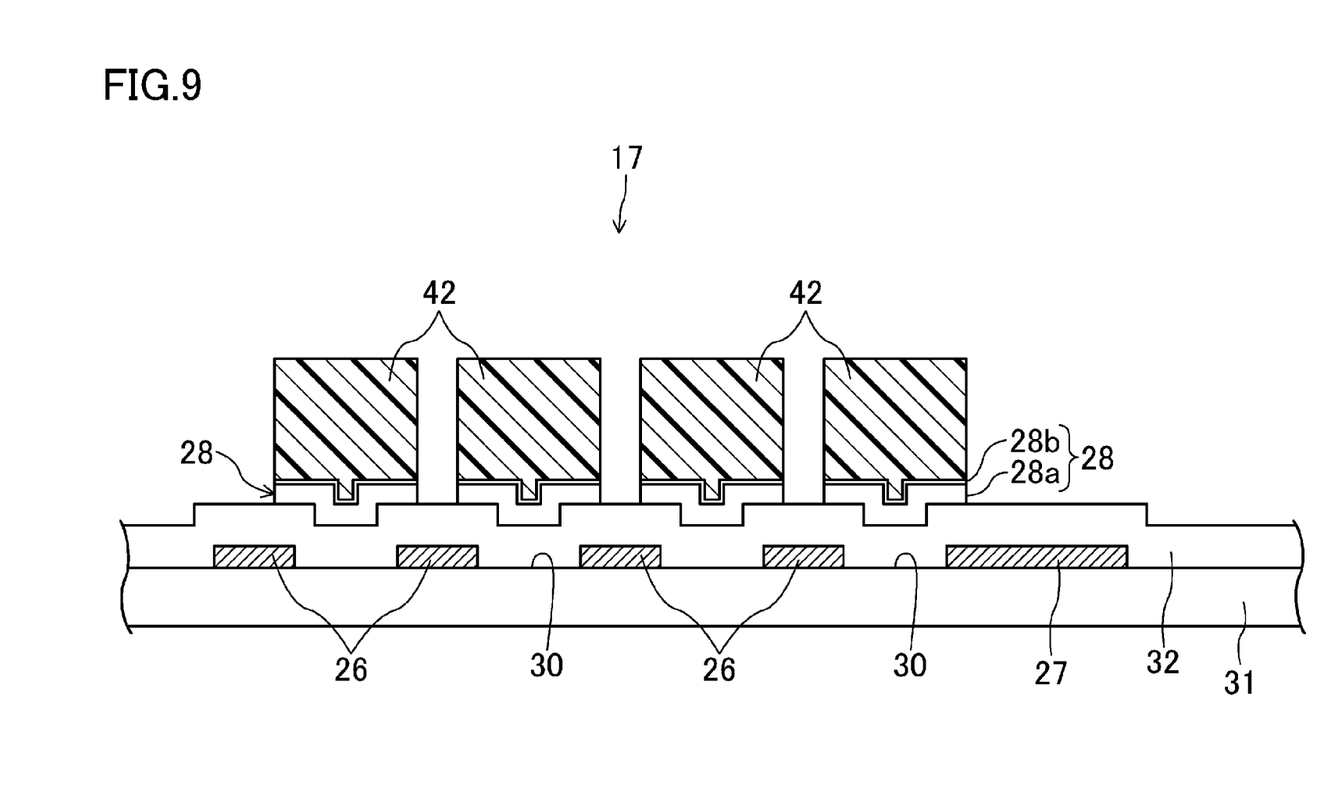
FIG. 9 is a cross-sectional view of second semiconductor layers formed by dry etching.
Figure 10:
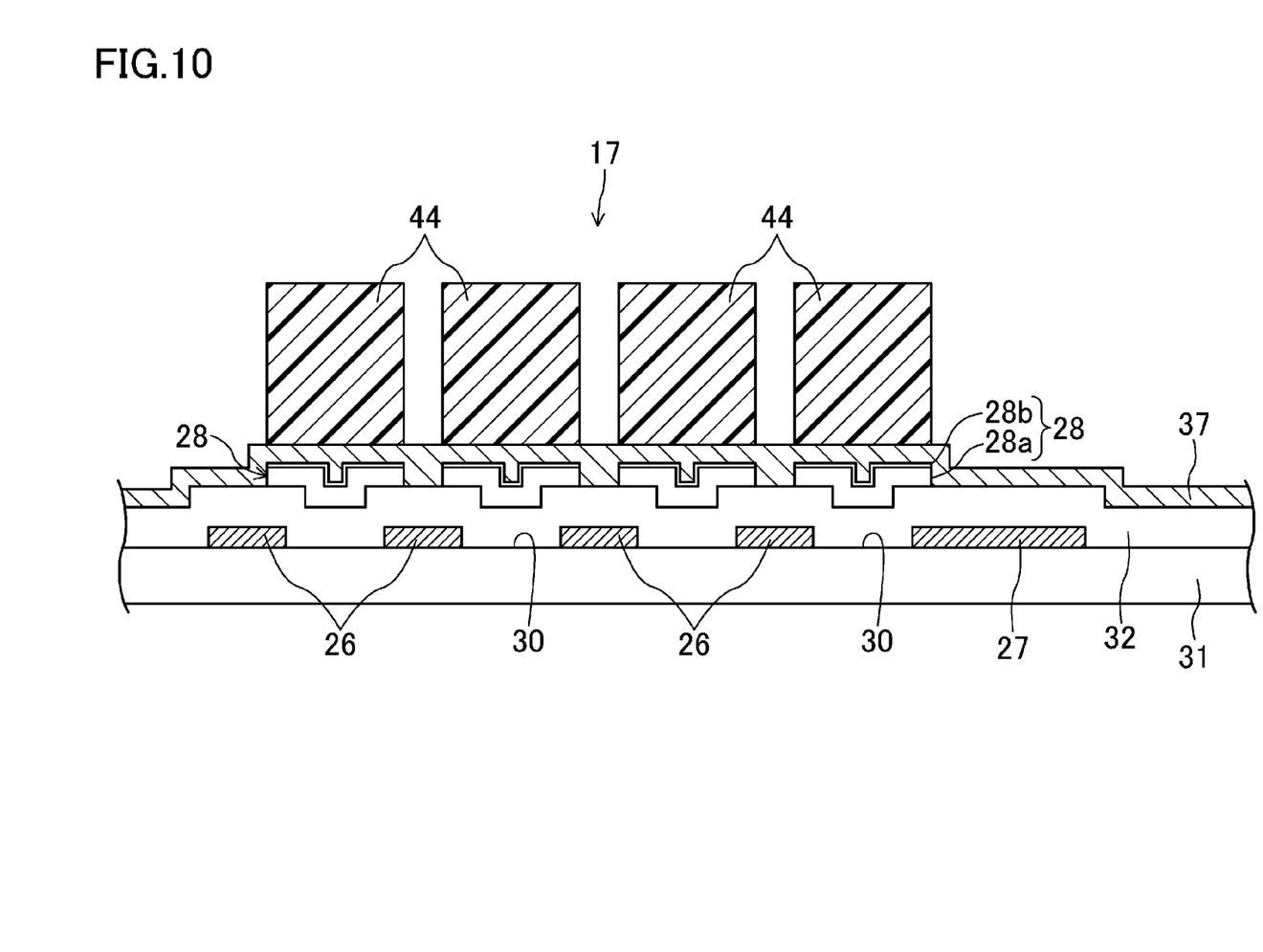
FIG. 10 is a cross-sectional view of fourth resists formed on the surface of a source material layer.

Here, FIG. 7 is a cross-sectional view of wiring layers 26, 27 formed on a glass substrate 31. FIG. 8 is a cross-sectional view of second resists 42 formed on the surface of a semiconductor material layer 35. FIG. 9 is a cross-sectional view of second semiconductor layers 28 formed by dry etching. FIG. 10 is a cross-sectional view of fourth resists 44 formed on the surface of a source material layer 37.

Figure 11:
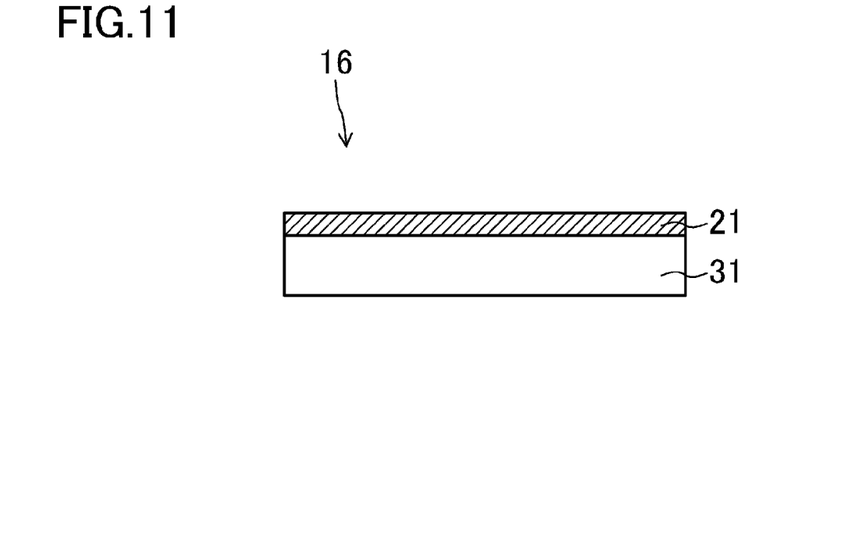
FIG. 11 is a cross-sectional view of a gate line formed on the glass substrate.
Figure 12:
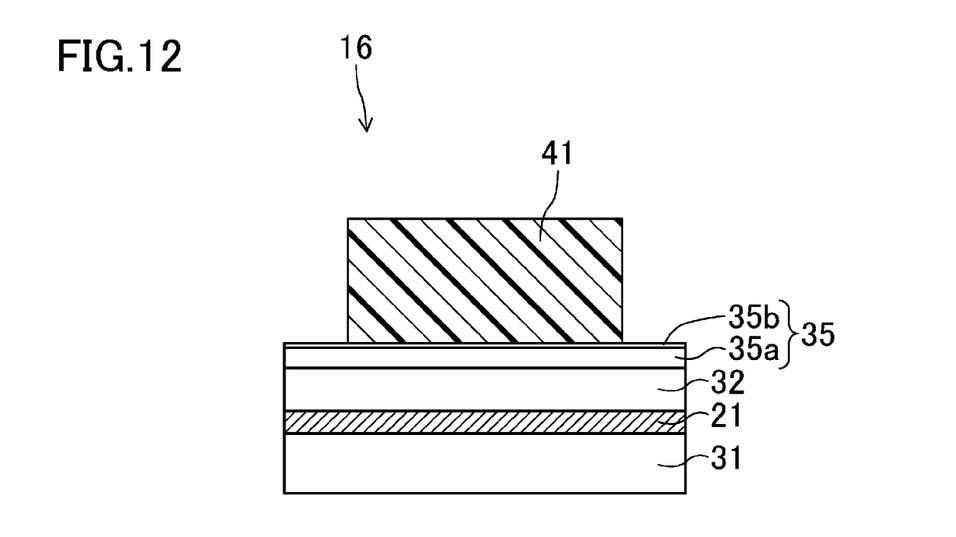
FIG. 12 is a cross-sectional view of a first resist formed on the surface of the semiconductor material layer.
Figure 13:
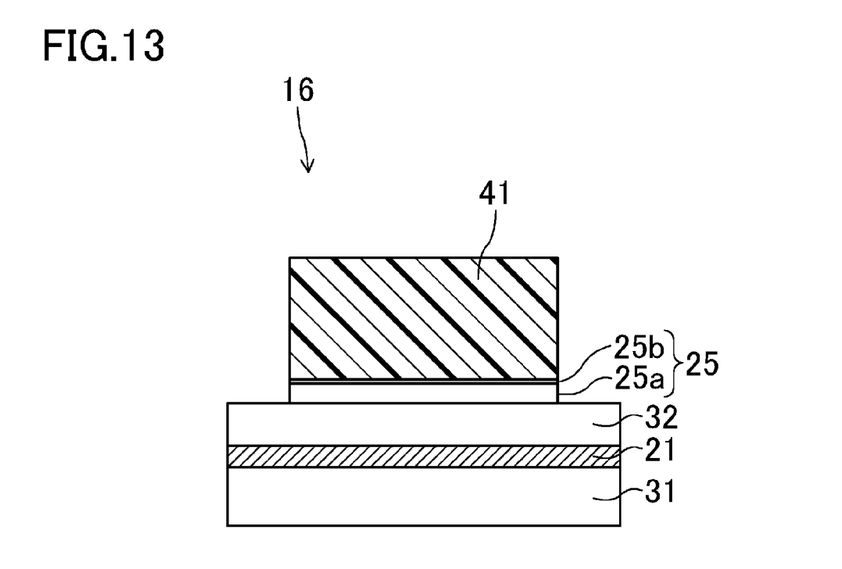
FIG. 13 is a cross-sectional view of a first semiconductor layer formed by dry etching.
Figure 14:
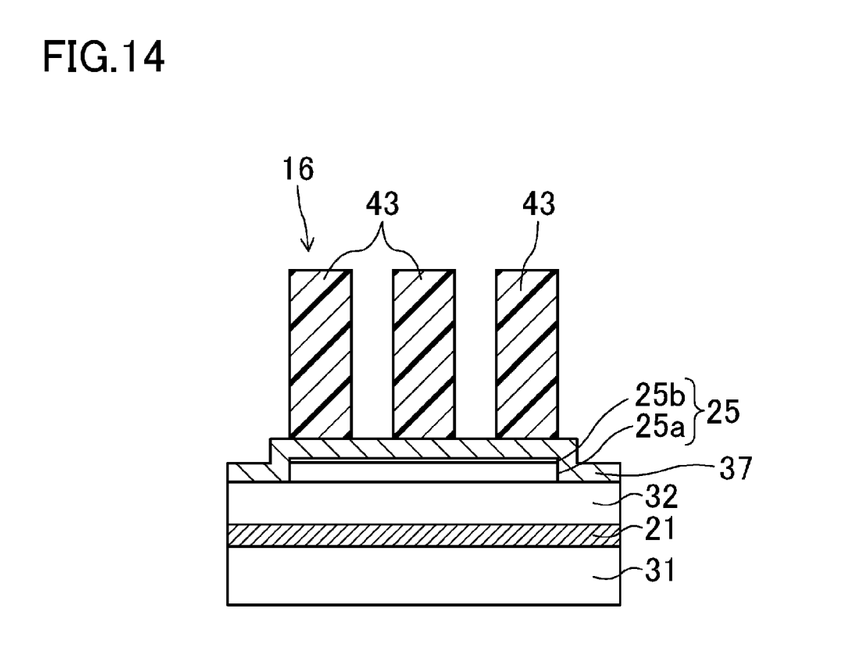
FIG. 14 is a cross-sectional view of third resists formed on the surface of the source material layer.

FIG. 11 is a cross-sectional view of a gate line 21 formed on the glass substrate 31. FIG. 12 is a cross-sectional view of a first resist 41 formed on the surface of the semiconductor material layer 35. FIG. 13 is a cross-sectional view of a first semiconductor layer 25 formed by dry etching. FIG. 14 is a cross-sectional view of third resists 43 formed on the surface of the source material layer 37.

First, a metal material layer (not shown) is deposited on the entire surface of the glass substrate 31, and the metal material layer is then subjected to photolithography and etching to form gate lines 21 in a pixel region 16 as illustrated in FIG. 11 and form a plurality of wiring layers 26, 27 in a frame region 17 as illustrated in FIG. 7. In other words, the wiring layers 26, 27 are made of the same material as the gate lines 21.

The gate lines 21 extend in parallel in the pixel region 16. In contrast, the wiring layers 26, 27 in the frame region 17 include a plurality of gate lead lines 26 extending in parallel, and a common line 27 extending in parallel to the gate lead lines 26.

Next, as illustrated in FIGS. 8 and 12, a gate insulating layer 32 is formed throughout the frame region 17 and the pixel region 16 to cover the wiring layers 26, 27 and the gate lines 21. This allows the wiring layers 26, 27 and the gate lines 21 on the glass substrate 31 to be directly covered with the gate insulating layer 32.

Next, as illustrated in FIGS. 8 and 12, the semiconductor material layer 35 is formed on the surface of the gate insulating layer 32 in the frame region 17 and the pixel region 16. Specifically, an i layer 35a is formed on the surface of the gate insulating layer 32 throughout the frame region 17 and the pixel region 16. Thereafter, an n+ layer 35b is formed on the surface of the i layer 35a throughout the frame region 17 and the pixel region 16. This allows the formation of the semiconductor material layer 35 including the i layer 35a and the n+ layer 35b.

Next, a resist material layer (not shown) is formed on the surface of the semiconductor material layer 35 throughout the frame region 17 and the pixel region 16. Thereafter, the resist material layer is subjected to, for example, photolithography to form first resists 41 and second resists 42 as masks.

Specifically, as illustrated in FIG. 12, the pixel region 16 includes the first resists 41 covering regions of the semiconductor material layer 35 where first semiconductor layers 25 of TFTs 20 in the pixel region 16 are to be formed. In contrast, as illustrated in FIG. 8, the frame region 17 includes the second resists 42 individually covering portions of the gate insulating layer 32 between adjacent pairs of the wiring layers 26, 27. In this case, the second resists 42 cover line-to-line regions 30 of the glass substrate 31 between the adjacent pairs of the wiring layers 26, 27 and lateral end portions of the wiring layers 26, 27 located laterally outward of the line-to-line regions 30.

Next, portions of the semiconductor material layer 35 exposed from the first and second resists 41 and 42 are etched by dry etching (reactive ion etching). This allows the pixel region 16 to include the first semiconductor layers 25 forming portions of the TFTs 20 as illustrated in FIG. 13 while allowing the frame region 17 to include second semiconductor layers 28 individually covering the line-to-line regions 30 as illustrated in FIG. 9.

Next, light blocking layers 29 are formed to individually cover portions of the gate insulating layer 32 between the adjacent pairs of the wiring layers 26, 27. Source lines 22, source electrodes 23, and drain electrodes 24 are also formed in the same process step as the process step of forming the light blocking layers 29. Thus, the light blocking layers 29 are made of the same material as the source lines 22, the source electrodes 23, and the drain electrodes 24.

Specifically, after the removal of the first and second resists 41 and 42, a source material layer 37 is formed on the gate insulating layer 32 throughout the frame region 17 and the pixel region 16 to cover the first semiconductor layers 25 and the second semiconductor layers 28. The source material layer 37 is made of a metal material.

Subsequently, a resist material layer (not shown) is formed on the surface of the source material layer 37 throughout the frame region 17 and the pixel region 16. Thereafter, the resist material layer is subjected to, for example, photolithography to form third resists 43 and fourth resists 44 as masks.

Specifically, as illustrated in FIG. 14, the pixel region 16 includes the third resists 43 covering regions of the source material layer 37 where the source lines 22 and the source electrodes 23 are to be formed and regions of the source material layer 37 where the drain electrodes 24 are to be formed. In contrast, as illustrated in FIG. 10, the frame region 17 includes the fourth resists 44 covering the second semiconductor layers 28. The fourth resists 44 individually cover the line-to-line regions 30 in a manner similar to that of the second semiconductor layers 28.

A region where each fourth resist 44 is formed may overlap a region where a corresponding one of the second semiconductor layers 28 is formed, or may be slightly smaller than the region where the corresponding one of the second semiconductor layers 28 is formed. This can prevent the fourth resists 44 from being partially outside the region where the corresponding one of the second semiconductor layers 28 is formed even if the fourth resists 44 are slightly displaced.

Next, portions of the source material layer 37 exposed from the third and fourth resists 43 and 44 are etched. This allows the pixel region 16 to include the source lines 22, the source electrodes 23, and the drain electrodes 24 as illustrated in FIGS. 3 and 4 while allowing the frame region 17 to include the light blocking layers 29 as illustrated in FIG. 2.

Thereafter, although not shown, the pixel region 16 and the frame region 17 include an interlayer insulating film covering the light blocking layers 29, the source lines 22, and other components. Pixel electrodes are formed on a region of the surface of the interlayer insulating film corresponding to the pixel region 16 to be each electrically continuous with a corresponding one of the drain electrodes 24. Thus, the TFT substrate 11 is fabricated.

—Advantages of Embodiment—

In view of the foregoing, according to this embodiment, in the process step of etching the semiconductor material layer 35 by dry etching, the frame region 17 includes the second resists 42 covering portions of the gate insulating layer 32 on the line-to-line regions 30 between adjacent pairs of the wiring layers 26, 27 as illustrated in FIGS. 8 and 9. This can prevent electrostatic discharge between an adjacent pair of the wiring layers 26, 27. Thus, dielectric breakdown of the gate insulating layer 32 covering the wiring layers 26, 27 can be prevented from occurring over the line-to-line regions 30.

Since, as such, no dielectric breakdown occurs in the gate insulating layer 32, the light blocking layers 29 on the surface of the gate insulating layer 32 can not only prevent light from leaking through the frame region 17, but also prevent short circuits through the light blocking layers 29 between the adjacent pairs of the wiring layers 26, 27.

Furthermore, since the light blocking layers 29 can be formed in the same process step as the process step of forming the source electrodes 23, an increase in the number of process steps due to the provision of the light blocking layers 29 can be prevented.

Moreover, since the light blocking layers 29 individually cover portions of the gate insulating layer 32 corresponding to the line-to-line regions 30, the parasitic capacitance between each light blocking layer 29 and a corresponding one of the wiring layers 26, 27 can be reduced.

OTHER EMBODIMENTS

While, in the embodiment, an example in which as illustrated in FIG. 8, when the semiconductor material layer 35 is etched by dry etching, the semiconductor material layer 35 is directly interposed between the second resists 42 and the gate insulating layer 32 has been described, the present invention should not be limited to the example. The second resists 42 merely need to be formed to cover portions of the gate insulating layer 32 corresponding to the line-to-line regions 30.

While, in the embodiment, a liquid crystal display has been described as an example, the present invention should not be limited to the liquid crystal display. The present invention can similarly apply also to other display devices, such as an organic EL display device including a light-emitting layer interposed between a TFT substrate 11 and a counter substrate 12, and a display device including a counter substrate 12 on which a touch panel layer is provided.

The semiconductor element in the pixel region 16 should not necessarily be limited to a TFT, and may be another semiconductor element, such as a thin film diode (TFD).

INDUSTRIAL APPLICABILITY

As described above, the present invention is useful for methods for fabricating an active matrix substrate, and methods for fabricating a display device.

DESCRIPTION OF REFERENCE CHARACTERS

1 Liquid Crystal Display
11 TFT Substrate (Active Matrix Substrate)
12 Counter Substrate
16 Pixel Region
17 Frame Region
20 TFT (Semiconductor Element)
21 Gate Line
23 Source Electrode
25 First Semiconductor Layer
26 Gate Lead Line (Wiring Layer)
27 Common Line (Wiring Layer)
29 Light Blocking Layer
30 Line-To-Line Region
32 Gate Insulating Layer
35 Semiconductor Material Layer
41 First Resist
42 Second Resist

The invention claimed is:

1. A method for fabricating an active matrix substrate, the method comprising:
forming, on a pixel region of the active matrix substrate, a gate line forming portions of a plurality of semiconductor elements, and forming a plurality of wiring layers on a frame region of the active matrix substrate surrounding the pixel region, the wiring layers being made of a same material as the gate line and extending in parallel;
forming a gate insulating layer on the frame region and the pixel region to cover the wiring layers and the gate line;
forming a semiconductor material layer on a surface of the gate insulating layer on the frame region and the pixel region;
forming a first resist covering a portion of the semiconductor material layer over the pixel region, and second resists individually covering portions of the gate insulating layer between adjacent pairs of the wiring layers; and
etching portions of the semiconductor material layer exposed from the first and second resists by dry etching to form semiconductor layers forming portions of the semiconductor elements; wherein
in the forming of the second resists, only portions of each of the adjacent pairs of the wiring layers are covered by each of the second resists with remaining portions of the adjacent pairs remaining uncovered by the second resists.

2. The method of claim 1 further comprising:
after the etching of the portions of the semiconductor material layer by dry etching, forming light blocking layers individually covering portions of the gate insulating layer between the adjacent pairs of the wiring layers.

3. The method of claim 2, wherein in the forming of the light blocking layers, the light blocking layers are made of a same material as a source electrode forming a portion of each semiconductor element.

4. The method of claim 3, wherein
in the forming of the light blocking layers, a predetermined space is formed between each of adjacent pairs of the light blocking layers, and
both side portions of wiring layers in each of the adjacent pairs of the wiring layers and a line-to-line region between the wiring layers in each of the adjacent pairs of the wiring layers are covered by corresponding one of the light blocking layers.

5. The method of claim 3, wherein in the forming of the light blocking layers, the light blocking layers are formed on surfaces of the semiconductor layers.

6. The method of claim 1 wherein,
in the forming of the wiring layers, a line-to-line region is formed between each of the adjacent pairs of the wiring layers,
in the forming of the second resists, a portion of each of the adjacent pairs of the wiring layers and the line-to-line region therebetween are covered by each of the second resists.

7. A method for fabricating a display device by bonding an active matrix substrate and a counter substrate together, the method comprising:
fabricating the active matrix substrate, wherein the fabricating of the active matrix substrate includes
forming, on a pixel region of the active matrix substrate, a gate line forming portions of a plurality of semiconductor elements, and forming a plurality of wiring layers on a frame region of the active matrix substrate surrounding the pixel region, the wiring layers being made of a same material as the gate line and extending in parallel;
forming a gate insulating layer on the frame region and the pixel region to cover the wiring layers and the gate line;
forming a semiconductor material layer on a surface of the gate insulating layer on the frame region and the pixel region;
forming a first resist covering a portion of the semiconductor material layer over the pixel region, and second resists individually covering portions of the gate insulating layer between adjacent pairs of the wiring layers; and
etching portions of the semiconductor material layer exposed from the first and second resists by dry etching to form semiconductor layers forming portions of the semiconductor elements; wherein
in the forming of the second resists, only portions of each of the adjacent pairs of the wiring layers are covered by each of the second resists with remaining portions of the adjacent pairs remaining uncovered by the second resists.

8. The method of claim 7 further comprising:
after the etching of the portions of the semiconductor material layer by dry etching, forming light blocking layers individually covering portions of the gate insulating layer between the adjacent pairs of the wiring layers.

9. The method of claim 8, wherein in the forming of the light blocking layers, the light blocking layers are made of a same material as a source electrode forming a portion of each semiconductor element.

10. An active matrix substrate comprising:
a substrate;
a pixel region located in a portion of the substrate and including a plurality of semiconductor elements;
a frame region located in a portion of the substrate and surrounding the pixel region;
a gate line located on the substrate;
a plurality of wiring layers made of a same material as the gate line and extending in parallel with each other;
a gate insulating layer located in the frame region and the pixel region and covering the plurality of wiring layers and the gate line; and
a plurality of semiconductor layers located on a surface of the gate insulating layer in the frame region and the pixel region; wherein
line-to-line-regions are located between adjacent pairs of the plurality of wiring layers;
in the frame region, a predetermined space is provided between each of adjacent pairs of the plurality of semiconductor layers over the plurality of wiring layers; and
both side portions of wiring layers in each of the adjacent pairs of the wiring layers and a line-to-line region therebetween are covered by a corresponding one of the plurality of semiconductor layers.

11. The active matrix substrate of claim 10, further comprising:
a plurality of light blocking layers individually covering portions of the gate insulating layer between the adjacent pairs of the plurality of wiring layers.

12. The active matrix substrate of claim 11, wherein
a predetermined space is provided between adjacent pairs of the plurality of the light blocking layers, and
both side portions of wiring layers in each of the adjacent pairs of the wiring layers and the line-to-line region between the wiring layers in each of the adjacent pairs of the wiring layers are covered by corresponding one of the light blocking layers.

13. The active matrix substrate of claim 11, wherein the light blocking layers are located on surfaces of the plurality of semiconductor layers.

* * * * *